(12) United States Patent
Carpentier

(10) Patent No.: US 7,005,726 B2
(45) Date of Patent: Feb. 28, 2006

(54) SEMICONDUCTOR DEVICE WITH AN IMPROVED TRANSMISSION LINE

(75) Inventor: Jean-Francois Carpentier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 89 days.

(21) Appl. No.: 10/466,899

(22) PCT Filed: Dec. 21, 2001

(86) PCT No.: PCT/FR01/04142

§ 371 (c)(1),
(2), (4) Date: Dec. 24, 2003

(87) PCT Pub. No.: WO02/058146

PCT Pub. Date: Jul. 25, 2002

(65) Prior Publication Data

US 2004/0089949 A1 May 13, 2004

(30) Foreign Application Priority Data

Jan. 22, 2001 (FR) .................................. 01 00819

(51) Int. Cl.
*H01L 23/552* (2006.01)
(52) U.S. Cl. .......................... 257/659; 455/327; 333/1; 333/112; 333/116; 333/118; 333/120; 333/128; 333/138
(58) Field of Classification Search ................ 455/327; 333/1, 112, 116, 118, 120, 128, 138
See application file for complete search history.

(56) References Cited

U.S. PATENT DOCUMENTS 5,634,208 A * 5/1997 Nishikawa et al. .......... 455/327

* cited by examiner

*Primary Examiner*—Mai-Huong Tran
(74) *Attorney, Agent, or Firm*—Lisa K. Jorgenson; Jose Gutman; Fleit, Kain, Gibbons, Gutman, Bongini & Bianco P.L.

(57) ABSTRACT

A semiconductor device with integrated circuits includes superimposed layers provided at different levels on a substrate, and including a metal strip (3) formed in a reference layer and through which an electric current passes, a metal ground plane (4) formed in a layer situated at a level lower than the reference layer and having a slit (5) which lies below the strip while running alongside it, an electrostatic shield (6) formed in a layer located at a level lower than the ground plane and comprising a multiplicity of spaced out bands (7), made of an electrically-conducting material, that extends across the slit, and conducting junctions (4a, 4b) making it possible to electrically connect the ends of each band to the parts of the ground plane situated on either side of its slit.

19 Claims, 4 Drawing Sheets

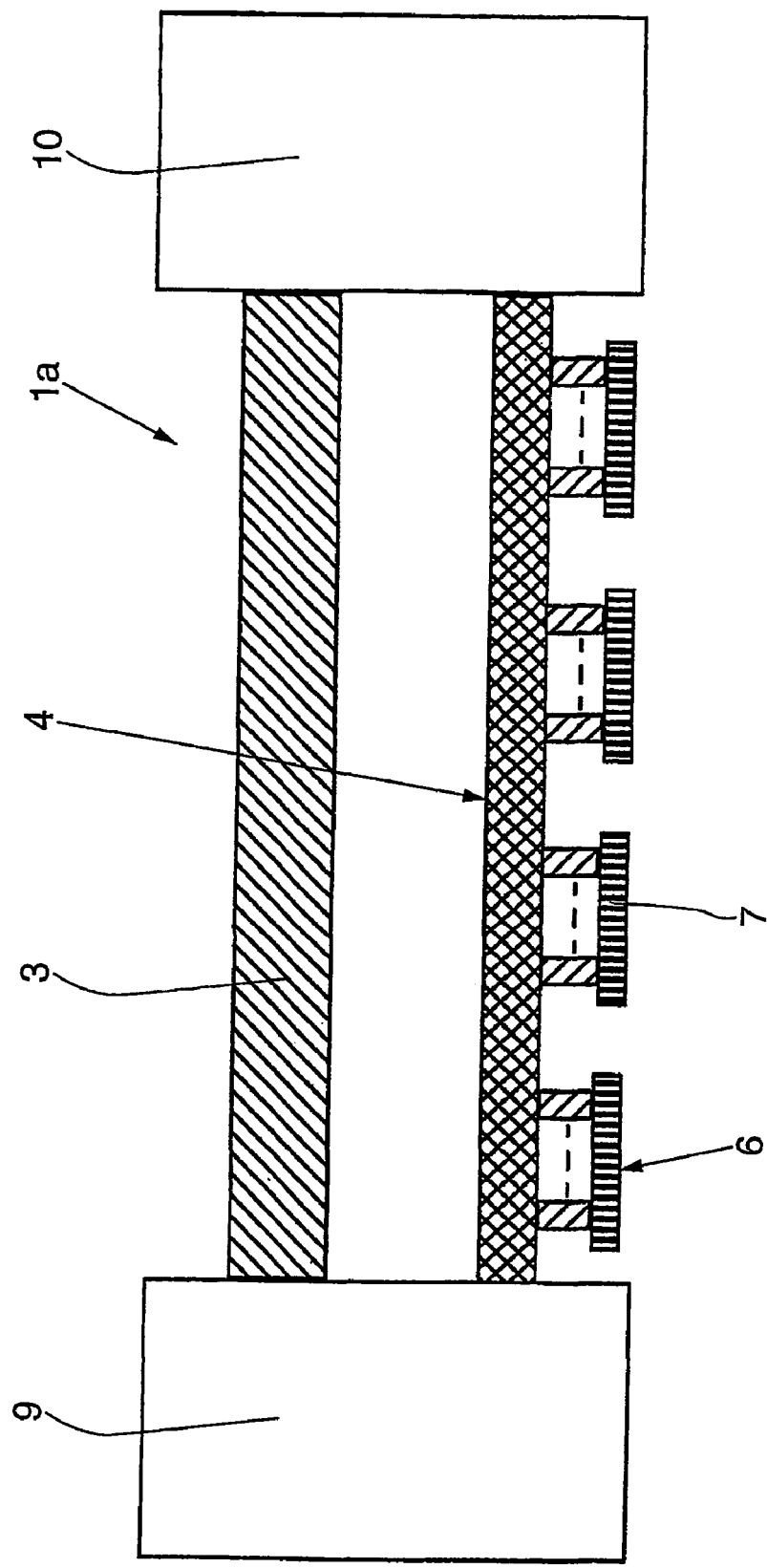

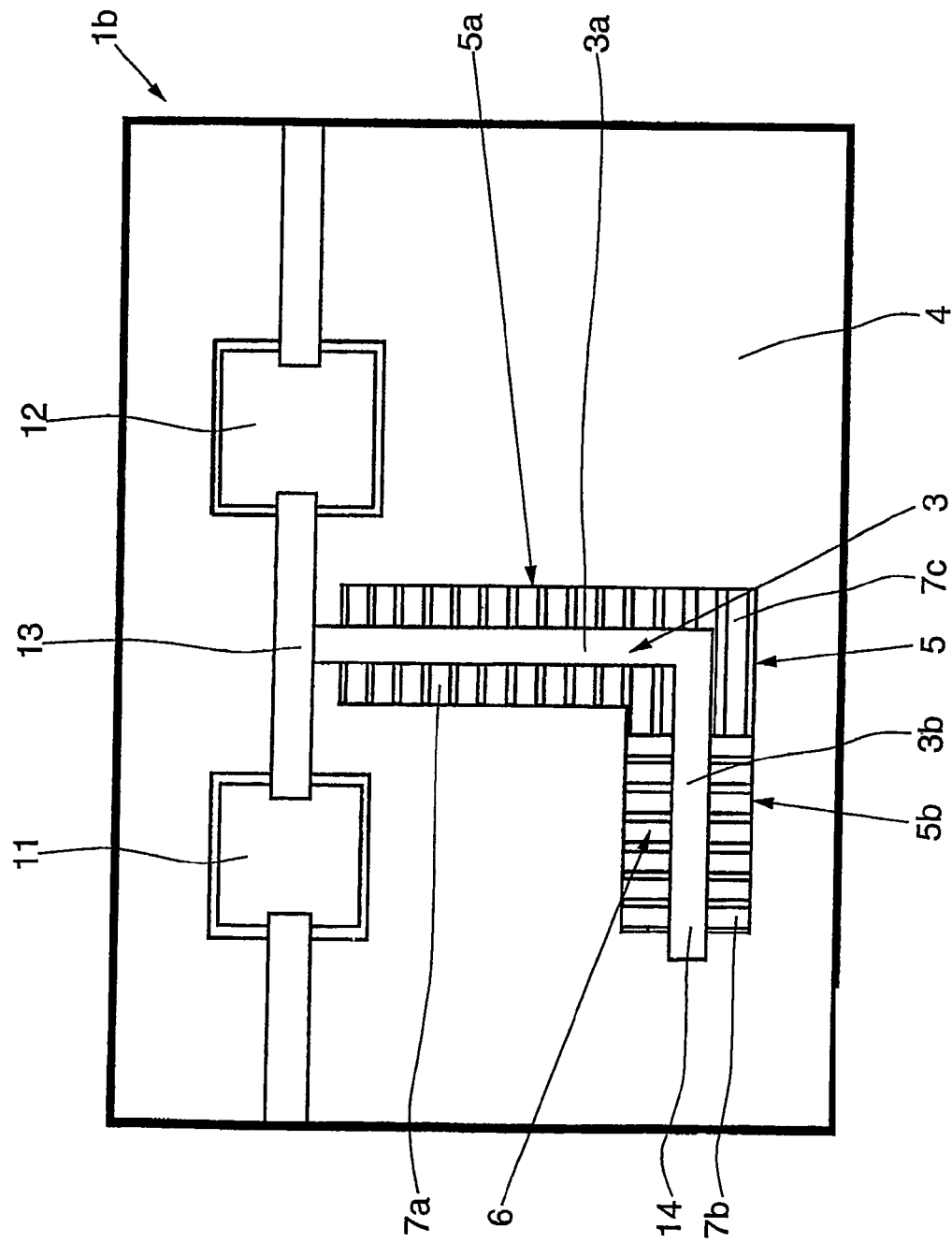

SEMICONDUCTOR DEVICE WITH AN IMPROVED TRANSMISSION LINE

CROSS-REFERENCE TO RELATED APPLICATIONS

This application is the National Stage of International Application No. PCT/FR01/04142 filed on Dec. 21, 2001, which is based upon and claims priority from prior French Patent Application No. 0100819 filed Jan. 22, 2001, the entire disclosure of which is herein incorporated by reference.

BACKGROUND OF THE INVENTION

1. Field of the Invention

The present invention relates to a semiconductor device with integrated circuits comprising superimposed layers provided at different levels on a substrate, the purpose of which is to produce at least one transmission line in such integrated circuits.

2. Description of Related Art

Conventionally, transmission lines through which an electric current passes, for the purpose of interconnecting the components of integrated circuits or for the purpose of producing integrated radiofrequency circuits, are formed by metal microstrips, which may be or are generally situated near a ground plane, at a short distance from the substrate generally consisting of silicon.

Given the small cross sections and, more particularly, the small thicknesses of said metal microstrips, such conventional transmission lines have high electrical losses. Furthermore, given the short distance between the microstrips and the ground planes, the inductance per unit length of these microstrips is small and the resulting capacitance per unit length is high, such that this leads to a low characteristic impedance of the assembly.

SUMMARY OF THE INVENTION

The purpose of the present invention is to produce, in a semiconductor device with integrated circuits, at least one low-loss transmission line with a high characteristic impedance.

The semiconductor device with integrated circuits which comprises superimposed layers provided at different levels on a substrate, comprises, according to the invention, a metal strip formed in a reference layer and through which an electric current passes, a metal ground plane formed in a layer situated at a level lower than the reference layer and having a slit which lies below said tape while running alongside it, an electrostatic shield formed in a layer located at a level lower than the ground plane and comprising a multiplicity of spaced out bands, made of an electrically-conducting material, which extends across said slit, and conducting junctions making it possible to electrically connect the ends of each band to the parts of the ground plane situated on either side of its slit.

According to a variant of the invention, said metal strip constitutes a line for interconnecting two integrated components.

According to another variant of the invention, said metal strip constitutes an inductor.

According to the invention, said conducting bands lie perpendicularly to the direction of said metal strip.

According to the invention, the opposed edges of said slit lie parallel to the opposed edges of said metal strip.

According to the invention, the end parts of said conducting bands lie below said metal ground plane, said conducting junctions lying perpendicularly to this plane.

According to the invention, said electrostatic shield is integrated into the surface of the substrate.

According to the invention, the width of said conducting bands is equal to the width of said metal strip.

According to the invention, said metal strip is preferably centered with respect to the direction of said slit and its width is at the most equal to the width of this slit.

According to the invention, the distance between said conducting bands is preferably less than their width.

According to the invention, the width of said slit is preferably between one and three times the width of said metal strip.

BRIEF DESCRIPTION OF THE DRAWINGS

The present invention will be better understood by studying integrated-circuit semiconductor devices comprising transmission lines, described by way of non-limiting examples and illustrated by the drawings in which:

FIG. 3 shows a side view of a first application of the aforementioned transmission line in a semiconductor device; and FIG. 4 shows a top view of a second application of the aforementioned transmission line in a semiconductor device.

DETAILED DESCRIPTION OF PREFERRED EMBODIMENTS

Figure 1:
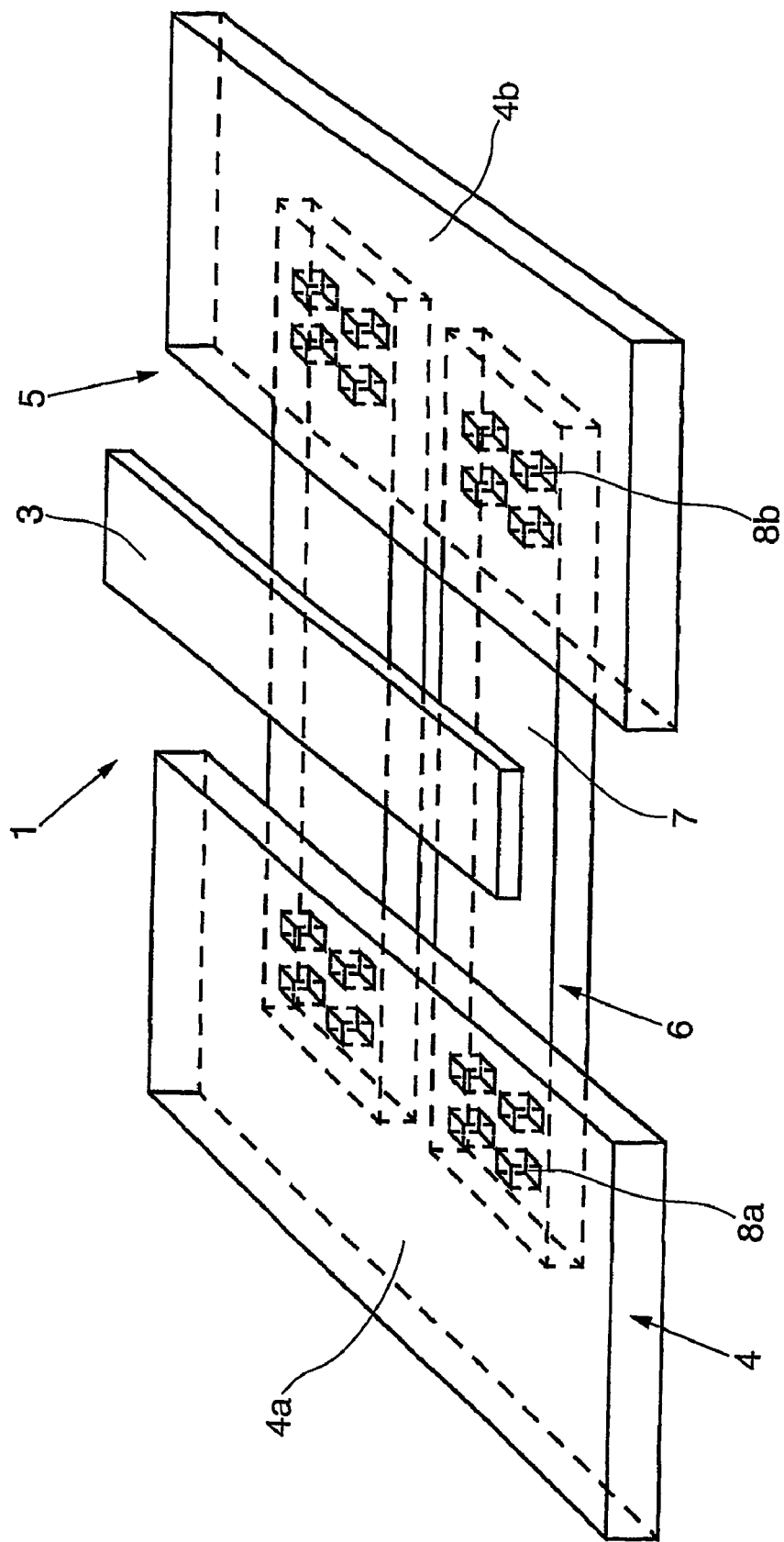
FIG. 1 shows a perspective view of a transmission line integrated in a semiconductor device of the present invention.
Figure 2:
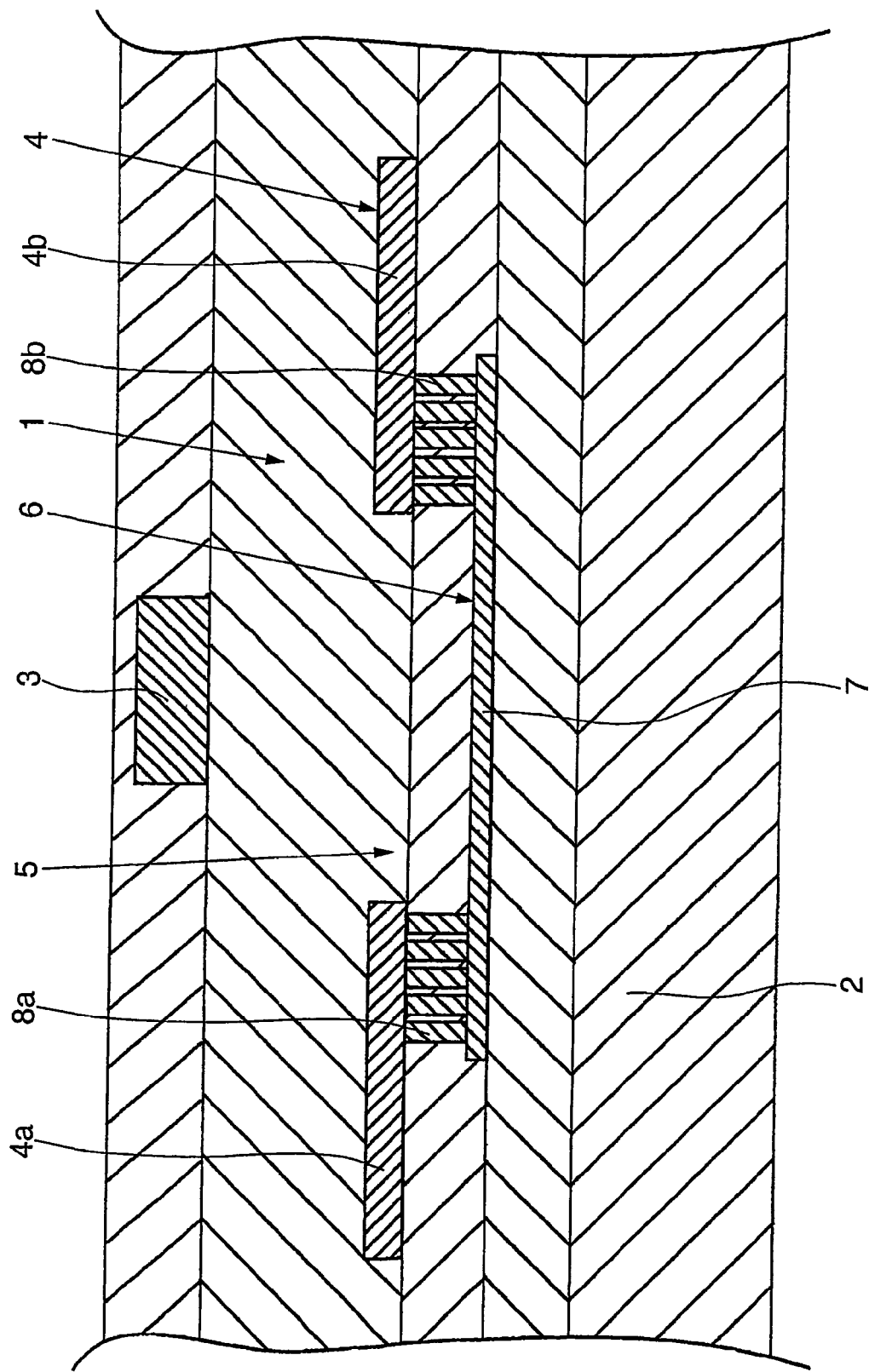
FIG. 2 shows a cross section of the transmission line of FIG. 1.

With reference to FIGS. 1 and 2, it can be seen that a semiconductor device 1 with several superimposed layers provided at different levels on a substrate 2 is shown.

The semiconductor device 1 comprises, in a layer located at a so-called reference layer, a longitudinal metal strip 3, of rectangular section, through which an electric current is able to pass.

In a layer situated at a level lower than that of the metal strip 3 which carries current, the semiconductor device 1 comprises a ground plane 4 which comprises two longitudinal metal ground strips 4a and 4b separated one from the other so as to form a longitudinal slit 5 which lies below the metal strip 3. The longitudinal edges of the ground strips 4a and 4b are parallel and lie parallel to the metal strip 3, the strip 3 being centered with respect to the slit 5.

Preferably, the width of the current-carrying metal strip 3 is at the most equal to the width of the slit 5 between the ground strips 4a and 4b.

In a layer located at a level lower than that of the ground plane 4, the semiconductor device 1 comprises an electrostatic shield 6 which consists of a multiplicity of bands 7 which lie across the slit 5 and which are spaced apart in the longitudinal direction. These bands 7 are made of an electrically conducting material, for example silicided polysilicon, and are of rectangular section.

The end parts of the conducting bands 7 lie below metal bands 4a and 4b of the ground plane 4 and are connected to the latter by means of electrically conducting vertical junctions 8a and 8b which constitute vias for example made of tungsten.

Preferably, the width of the conducting band 7 constituting the electrostatic shield 6 is preferably equal to the width of the metal strip 3 and the space separating these conducting bands 7 is preferably less than their width and preferably chosen to be the minimum permitted by the fabrication technology employed.

In a specific exemplary embodiment, the vertical distance between the current-carrying metal strip 3 and the ground plane 4 is approximately equal to 4 microns, the distance between the ground plane 4 and the electrostatic shield 6 is approximately equal to 2 microns and the distance between the metal shield 6 and the surface of the substrate 2 is approximately equal to 0.4 microns. In a variant embodiment, the electrostatic shield 6 could be affixed to the surface of the substrate 2.

Since the width of the current-carrying longitudinal strip 3 is approximately equal to 20 microns, it is desirable that the width of the slit 5 is between one and three times the width of the metal strip 3.

Of course, the strip 3, the ground, plane 4, the shield 6 and the junctions 8a and 8b are made in the dielectric layers.

The arrangement which has just been described has the following advantages.

By virtue of providing the slit 5 in the ground plane 4, which moves the latter away from the current-carrying strip 3, it is possible to increase the width of the latter while keeping a high inductance per unit length and to benefit from the width of the ground strips 4a and 4b of the ground plane 4 situated laterally in order to carry the current returns.

Furthermore, the electrostatic shield 6 consisting of the conducting bands 7 makes it possible to reduce the current losses within the substrate 2 since it prevents the electric field created by the metal strip 3 from reaching the substrate 2 and, at minimum, limits its effect in the latter so as not to disturb the other components of the semiconductor device 1.

With reference to FIG. 3, it can be seen that a semiconductor device 1a is seen, in which the metal strip 3 constitutes a means of interconnecting the two components 9 and 10, for example two passive elements, the slit 5 lying approximately over the whole distance separating these components 9 and 10 and the transverse conducting bands 7 of the electrostatic shield 6 being regularly spaced out along the latter.

With reference to FIG. 4, a semiconductor device 1b is shown, in which the metal strip 3 constitutes the inductance of an LC circuit.

In this embodiment, the semiconductor device 1b comprises two capacitors 11 and 12 electrically connected by a straight metal strip 13 which lies at the same level as the metal strip 3.

The current-carrying metal strip 3 is laid out in the shape of an L which has a branch 3a which lies perpendicularly to the straight strip 13 and the end of which is connected substantially to the middle of the latter, together with a branch 3b which lies perpendicularly to its branch 3a and the free end of which is connected to the ground plane 4 by a vertical junction 14.

The slit 5 provided in the ground plane 4 also lies in the shape of an L, the branches 5a and 5b of which run, at a distance, alongside the branches 3a and 3b of the strip 3, as described above.

The electrostatic shield 6 comprises conducting bands 7a, which lie transversely to the branch 5a of the slit 5, and conducting bands 7b, which lie transversely to the branch 5b of the slit 5. In the region of the junction between the branches 5a and 5b of the slit 5, the electrostatic shield 6 comprises bands 7c which are parallel to the conducting bands 7a and one end of which is connected to the ground plane 4 as described above and their other end is connected to the first of the conducting bands 7b.

The present invention is not limited to the examples described above. Many variant embodiments are possible without departing from the scope defined by the claims.

The invention claimed is:

1. A circuit supporting substrate semiconductor device comprising:
   superimposed layers provided at different levels on a substrate;
   a metal strip formed in a reference layer and through which an electric current passes;
   a metal ground plane formed in a layer situated at a level lower than the reference layer and having a slit which lies below the metal strip while running alongside it;
   an electrostatic shield formed in a layer located at a level lower than the ground plane and comprising a multiplicity of spaced out bands, made of an electrically-conducting material, which extends across the slit; and
   conducting junctions making it possible to electrically connect the ends of each band to the parts of the ground plane situated on either side of its slit.

2. The circuit supporting substrate semiconductor device according to claim 1, wherein the metal strip constitutes an inductor.

3. The circuit supporting substrate semiconductor device according to claim 1, wherein the conducting bands lie perpendicularly to the direction of the metal strip.

4. The circuit supporting substrate semiconductor device according to claim 1, wherein the opposed edges of the slit lie parallel to the opposed edges of the metal strip.

5. The circuit supporting substrate semiconductor device according to claim 1, wherein the end parts of the conducting bands lie below the metal ground plane, the conducting junctions lying perpendicularly to this plane.

6. The circuit supporting substrate semiconductor device according to claim 1, wherein the electrostatic shield is integrated into the surface of the substrate.

7. The circuit supporting substrate semiconductor device according to claim 1, wherein the width of the conducting bands is equal to the width of the metal strip.

8. The circuit supporting substrate semiconductor device according to claim 1, wherein the metal strip is centered with respect to the direction of the slit and in that its width is at the most equal to the width of this slit.

9. The circuit supporting substrate semiconductor device according to claim 1, wherein the distance between the conducting bands is less than their width.

10. The circuit supporting substrate semiconductor device according to claim 1, wherein the width of the slit is between one and three times the width of the metal strip.

11. A semiconductor device comprising:
   superimposed layers provided at different levels on a substrate;
   a metal strip formed in a reference layer and through which an electric current passes, and wherein the metal strip constitutes a line for interconnecting two integrated components;
   a metal ground plane formed in a layer situated at a level lower than the reference layer and having a slit which lies below the metal strip while running alongside it, and wherein the metal strip is substantially centered with respect to the direction of the slit and in that the width of the metal strip is at the most equal to the width of the slit;

an electrostatic shield formed in a layer located at a level lower than the ground plane and comprising a multiplicity of spaced out bands, made of an electrically-conducting material, which extends across the slit; and conducting junctions making it possible to electrically connect the ends of each band to the parts of the ground plane situated on either side of its slit.

12. The semiconductor device according to claim 11, wherein the conducting bands lie perpendicularly to the direction of the metal strip.

13. The semiconductor device according to claim 11, wherein the opposed edges of the slit lie parallel to the opposed edges of the metal strip.

14. The semiconductor device according to claim 11, wherein the end parts of the conducting bands lie below the metal ground plane, the conducting junctions lying perpendicularly to this plane.

15. The semiconductor device according to claim 11, wherein the electrostatic shield is integrated into the surface of the substrate.

16. The semiconductor device according to claim 11, wherein the width of the conducting bands is equal to the width of the metal strip.

17. The semiconductor device according to claim 11, wherein the distance between the conducting bands is less than their width.

18. The semiconductor device according to claim 11, wherein the width of the slit is between one and three times the width of the metal strip.

19. An integrated circuit comprising:

a circuit supporting substrate comprising superimposed layers provided at different levels on the circuit supporting substrate;

a metal strip formed in a reference layer and through which an electric current passes, and wherein the metal strip comprises a line for interconnecting at least two integrated circuit components;

a metal ground plane formed in a layer situated at a level lower than the reference layer and having a slit which lies below the metal strip while running alongside it, and wherein the the width of the metal strip is at the most equal to the width of the slit;

an electrostatic screen formed in a layer located at a level lower than the ground plane and comprising a multiplicity of spaced out bands, made of an electrically-conducting material, which extends across the slit; and conducting junctions making it possible to electrically connect the ends of each band to the parts of the ground plane situated on either side of the slit.

* * * * *

UNITED STATES PATENT AND TRADEMARK OFFICE
CERTIFICATE OF CORRECTION

PATENT NO. : 7,005,726 B2
DATED : February 28, 2006
INVENTOR(S) : Jean-Francois Carpentier It is certified that error appears in the above-identified patent and that said Letters Patent is hereby corrected as shown below:

Column 6,
Line 15, change "wherein the the width" to -- wherein the width --.

Signed and Sealed this

Twenty-third Day of May, 2006

JON W. DUDAS
*Director of the United States Patent and Trademark Office*